Feb. 1, 1966 D. G. GRABBE 3,233,034

DIFFUSION BONDED PRINTED CIRCUIT TERMINAL STRUCTURE

Filed Oct. 26, 1964 2 Sheets-Sheet 1

INVENTOR.
DIMITRY G. GRABBE

BY Charles A. Blank

ATTORNEY.

DIFFUSION BONDED PRINTED CIRCUIT TERMINAL STRUCTURE

Filed Oct. 26, 1964 2 Sheets-Sheet 2

INVENTOR
DIMITRY G. GRABBE
BY Charles A. Blank
ATTORNEY

United States Patent Office 3,233,034
Patented Feb. 1, 1966

3,233,034
DIFFUSION BONDED PRINTED CIRCUIT TERMINAL STRUCTURE

Dimitry G. Grabbe, 131 8th Ave., Sea Cliff, N.Y.

Filed Oct. 26, 1964, Ser. No. 422,870
16 Claims. (Cl. 174—68.5)

This application is a continuation-in-part of my copending application Serial No. 183,221, filed March 28, 1962, (now abandoned) and entitled "Printed Circuit Structure" and this application is a continuation-in-part of my copending application Serial No. 298,531, filed July 26, 1963, (now abandoned) and entitled "Printed Circuit Structure and Method." The combined specifications of the aforesaid applications Serial No. 183,221 and 298,531 together constitute the entire disclosure of the present application. Application Serial No. 183,221 is a continuation-in-part of my application Serial No. 145,892, filed October 18, 1961, (now abandoned) and entitled "Printed Circuit Structure and Method of Making Same."

This invention relates to printed circuit structures.

Printed circuit structures generally comprise insulating supports having copper conductors adherent thereto. Printed circuit structures include, for example, one-sided, two-sided and multilayer structures. The copper conductors may be formed by, for example, suitable photoprinting, plating, and etching techniques or by mechanical techniques for making conductors having the general appearance of conductors made by printing, plating or etching techniques. The manufacturing process may be, for example, a copper-additive or a copper-subtractive process. Electrical terminals in the form of lugs are ordinarily soldered to the copper conductors, or wire conductors of electrical components are soldered directly to the copper conductors. Such soldered connections may fail under extreme temperature cycling or shock and vibration by becoming intermittent or noisy.

Welded connections between the electrical wire conductors and the copper conductors are most desirable from an electrical standpoint, but it is not possible ordinarily to spot weld the electrical wire conductors to the copper conductors at the printed circuit because the current necessary for welding is larger than can be carried by the copper conductors which are normally thin, for example, .0013 inch or .0027 inch thickness, with the result that the copper conductors or the base material under the weldspots are damaged in the welding process.

Brazing is ordinarily not suitable for connecting electrical wire conductors to the copper conductors because the temperature at which brazing must be accomplished is above the breakdown temperature of the insulator support for the copper conductors.

It is an object of the present invention, therefore, to provide a new and improved printed circuit structure having electrical terminals which are integral with the conductors of the printed circuit structure.

It is another object of the invention to provide a new and improved printed circuit structure having electrical terminals which are metallurgically integral with the conductors of the structure.

It is an object of the present invention to provide a new and improved printed circuit structure particularly suitable for use in minature applications wherein the leads of integral or packaged circuit components may be welded to the printed circuit structure by a welding process in which the welding electrodes are positioned on opposite sides of a printed circuit board.

It is another object of the invention to provide a new and improved method of making a printed circuit structure having electrical terminals which are metallurgically integral with the conductors of the structure and which are suitable for welding of the leads of components thereto by an opposed electrode welding process.

In accordance with the invention, a printed circuit structure comprises an insulating member carrying conductive printed circuit members and having apertures having conductive metal coatings integral with the aforesaid conductive members. The structure includes conductive terminals disposed in the apertures and diffusion bonded to the coatings of the apertures by an alloy of the surface material of the terminals with at least one member selected from the group consisting essentially of indium, gallium, pure tin, indium alloys containing a major proportion of indium, and gallium alloys containing a major proportion of gallium, and by an alloy of the material of the metal coatings of the apertures with the aforesaid selected member, the selected member being substantially diffused into the terminals and into the metal coatings of the apertures.

Also in accordance with the invention, a printed circuit structure comprises an insulating member having conductive members coated thereon and having conductively coated apertures integral with said conductive members, and conductive terminals disposed in said apertures, at least one of the groups of aperture coatings and terminals having a longitudinal taper, and said terminals being diffusion bonded to said aperture coatings.

For a better understanding of the present invention, together with other and further objects thereof, reference is made to the following description, taken in connection with the accompanying drawings, and its scope will be pointed out in the appended claims.

Referring now to the drawings.

Figure 1:
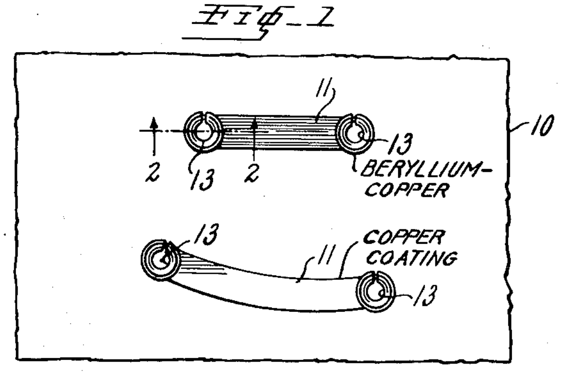
FIG. 1 is a plan view of a printed circuit structure constructed in accordance with the present invention.

Referring now more particularly to FIG. 1 of the drawings, a method of making a printed circuit structure comprises forming on an insulating member 10, for example, a phenolic or epoxy-glass board, conductive members 11 which preferably are of a non-ferrous metal or a nonferrous alloy such as copper strips formed by photoprinting, plating or etching techniques or, for example, beryllium copper, zinc, aluminum, tin or brass strips. Also suitable for the body or base material of the conductive members 11 are antimony, bismuth, cadmium, gold, lead, magnesium, manganese, molybdenum, palladium, platinum, silver, titanium and zirconium. Alloys having major proportions by weight of any one or a plurality of the foregoing materials above-identified as being preferred or suitable for the body material of the conductive members 11 may also be used for the material of the conductive members 11. Copper-nickel alloy having a major proportion by weight of copper is suitable for the body material of the conductive members 11.

Indium will diffuse into numerous other materials which may also be employed as body materials for the members 1, but the rate of diffusion ordinarily is slower.

Figures 2, 3, 4, 5, 6:
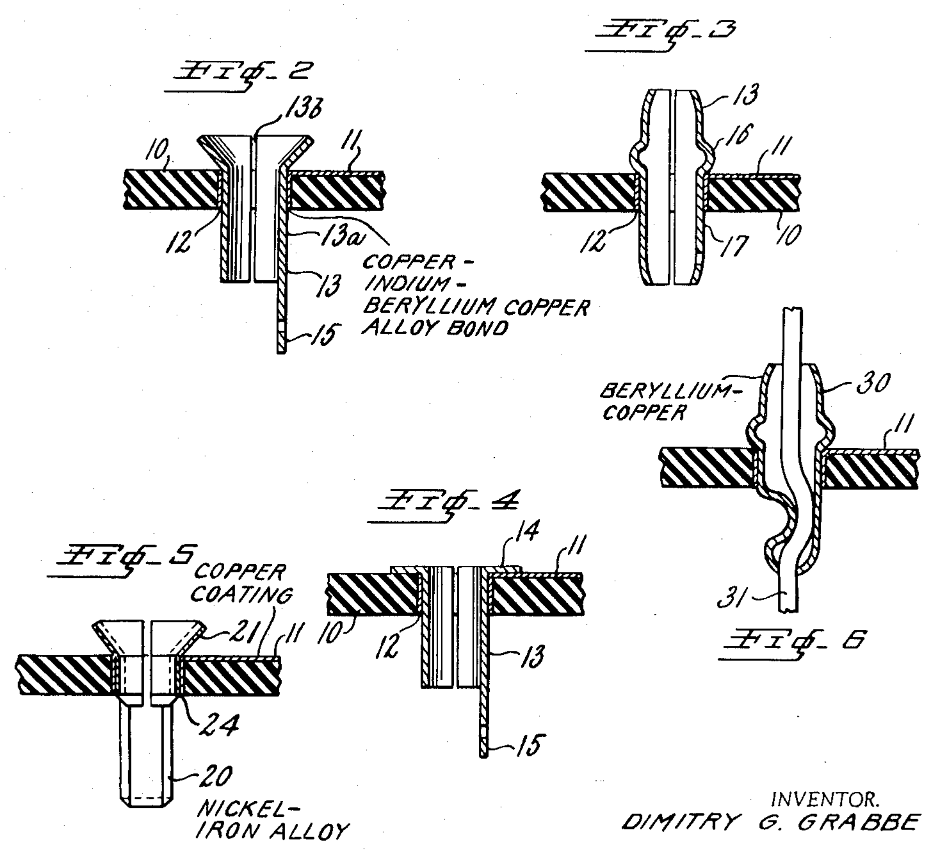
FIG. 2 to FIG. 6 are section views of terminals suitable for use in the FIG. 1 structure.

The insulating member 10 preferably has copper-coated apertures 11 therein integral with the copper strips 11. These apertures may be more readily seen in FIGS. 2 to 4, inclusive. There are represented in FIGS. 2 to 4, inclusive, examples of electrical terminals 13 each having a substantially annular cross-section 13*a* over a portion thereof and having a longitudinal slot 13*b* along the aforesaid portion to form a spring member adapted for insertion in an aperture of the printed circuit structure and adapted for connection of an electrical wire conductor thereto. At least one of the groups of terminals and apertures is coated with at least one member selected from the group consisting essentially of indium, gallium, tin, indium alloys and gallium alloys. Preferably the terminals are beryllium copper or other non-ferrous metal or non-ferrous alloy such as copper, zinc, tin, aluminum or brass or the terminals may be of any of the body materials mentioned above as being suitable for the conductive members 11. As will be more fully explained subsequently, the terminals may be of a multiple, laminated structure of metals, such as alloy 42 (nickel-iron) clad with copper or copper bearing alloy on their external surfaces or on their internal and external surfaces. The terminals preferably are electroplated to a thickness of 25 x $10^{-6}$ inch with indium, which has a melting point of 312° F. Suitable indium and gallium alloys are, for example, tin-indium, aluminum-indium and zinc-indium having an indium content of at least 50% by weight and tin-gallium, aluminum-gallium and zinc-gallium having a gallium content of at least 50% by weight. Obviously, a plurality of the materials, for example, tin, aluminum and zinc, suitable for alloying with indium or gallium may form the minor proportion of the indium alloy or the minor proportion of the gallium alloy.

In lieu of indium coating the terminals 13 or in addition to indium coating the terminals 13, the copper coatings of the apertures 12 may be coated with at least one member selected from the group consisting essentially of indium, gallium, tin, indium alloys and gallium alloys. Also, the entire surface of the copper conductors 11 may be coated with at least one member selected from the group consisting essentially of indium, gallium, tin, indium alloys and gallium alloys to facilitate coating the apertures 12.

The method also includes the step of inserting the terminals into the apertures, preferably by forcing into the apertures terminals which have a greater cross-sectional diameter than the apertures so that a lateral or radial pressure of, for example, 30 pounds per square inch is exerted between the terminals and the coatings of the apertures. The structure is then disposed at a temperature sufficient to form a diffusion bond between the terminals and the coatings of the apertures. Preferably the terminals are indium-coated and the structure is heated to a temperature of, for example, 500° F. which is above the melting point of indium, namely, 312° F. and below the breakdown point of the insulating member, for example, 600° F., to form an indium diffusion bond.

When the structure is heated to a temperature above 312° F., the indium melts and diffuses into the copper terminals and into the copper alloy coatings of the apertures. After the structure has been maintained at a temperature above the melting point of indium for a relatively short period of, for example, 30 minutes, the diffusion process can be continued at room temperature, but at a much slower pace. After the diffusion process is completed, the terminals are bonded to the coatings of the apertures by a copper-indium alloy and the pure indium is believed to be substantially completely consumed.

The bond as a high "pull" strength of, for example, 70 pounds necessary to break the bond as compared with, for example, 38 pounds for a dip soldered terminal of .062 inch outer diameter by .093 inch long. The high "pull" strength is accomplished by the existence of the bond over substantially the entire bounding surface of the aperture and the high shear strength (approximately 26,000 pounds per square inch) of the copper-indium alloy junction. Further, bonding area may be provided between a flange 14 of the terminal 13 and a copper member 11 as represented in FIG. 4. The copper-indium alloy has a melting point of approximately 900° C., and thus an alloy having a high melting point and serving as a bond is formed at a relatively low temperature.

As represented in FIGS. 2 to 4, the terminals may have various shapes preferably for the insertion of a wire conductor therethrough. For convenience, the FIG. 2 and FIG. 4 terminals have extensions 15 to which the wire components may be welded, wrapped, crimped or soldered. The FIG. 3 terminal has an annular rim portion 16 of greater cross-sectional area than the body 17 of the terminal to provide additional radial spring or pressure against the coatings of the apertures.

Referring now more particularly to FIG. 5 of the drawings, there is represented a printed circuit structure utilizing a terminal 20 having a body of a ferrous alloy, for example, a nickel-iron alloy consisting of 58% nickel and 42% iron, known commercially as alloy 42. Indium, gallium, tin, the indium alloys and the gallium alloys mentioned above as being suitable for coating the terminals of the FIGS. 1–4 embodiments will not readily diffuse into iron or ferrous alloys. Accordingly, the terminal 20 is coated, for example, by electroplating, with a layer 21 a non-ferrous metal or a non-ferrous alloy, for example, copper or any of the non-ferrous metals and non-ferrous alloys previously mentioned as being suitable for the bodies of the terminals of the FIG. 1–4 embodiments. A layer of indium, gallium, tin, any of the indium alloys or any of the gallium alloys mentioned above as being suitable for coating the terminals of the FIGS. 1–4 embodiment is coated, for example, by electroplating, over the copper layer of the terminal or is coated over the wall of the aperture 24 or both. The copper layer has a thickness of, for example, .001 inch. The terminal 20 is otherwise similar to the terminals of FIGS. 1–4 and preferably has a diameter slightly greater than the cross-sectional diameter of the aperture 24 to develop a lateral or radial pressure of, for example, 30 pounds per square inch between the terminal and the coating of the aperture 24. A diffusion bond is then provided between the terminal and the coating of the aperture by heating the terminal in the same manner as previously described in connection with the FIGS. 1–4 terminals. The terminal 20 may also be coated internally with a non-ferrous metal or a non-ferrous alloy to facilitate an internal indium diffusion bond in accordance with the method described in connection with FIG. 6.

Referring now to FIG. 6, there is represented a terminal 30 similar to the FIG. 3 termnial having, for example, an indium external coating and also having an internal coating of indium, gallium, tin, any of the indium alloys or any of the gallium alloys mentioned above as being suitable for coating the terminals of the FIGS. 1–4 embodiments. A wire conductor 31 is inserted in the terminal 30 and the terminal may then be crimped against the conductor so that the indium-coated inner wall is against the conductor. Alternatively, the conductor may be coated with indium, and it is then unnecessary to coat the inner wall with indium. After the wire conductor has been inserted, the entire structure may be heated in a manner similar to that previously described in connection with the FIGS. 1–4 terminals to provide an indium diffusion bond between the terminals and the coatings of the apertures and between the wire conductor 31 and the terminal 30.

Figure 7:
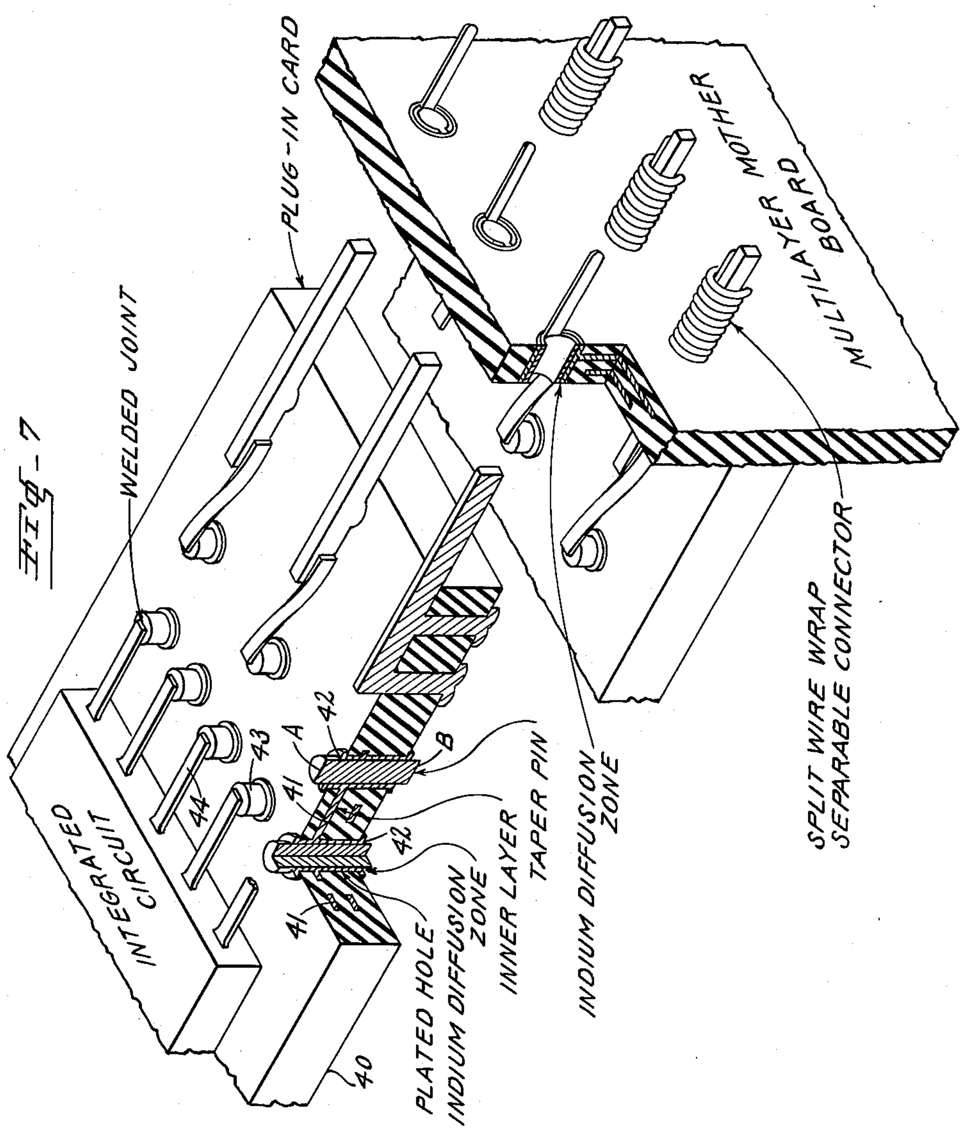
FIG. 7 is a perspective view of a printed circuit structure, partially broken away, constructed in accordance with the present invention.

Referring now more particularly to FIG. 7, a method of making a printed circuit structure comprises forming on or between layers of epoxy-glass board, conductive members 41 which preferably are of a non-ferrous metal or a non-ferrous alloy such as copper strips formed by photoprinting, plating or etching techniques or, for example, beryllium copper, zinc, aluminum, tin or brass strips. Also suitable for the body or base material of the conductive members 41 are antimony, bismuth, cadmium, gold, lead, magnesium, manganese, molybdenum, palladium, platinum, silver, titanium and zirconium. Alloys having major proportions by weight of any one or a plurality of the foregoing materials above-identified as being preferred or suitable for the body material of the conductive members 41 may also be used for the material of the conductive members 41. Copper-nickel alloy having a major proportion by weight of copper is suitable for the body material of the conductive members 41.

Indium will diffuse into numerous other materials which may also be employed as body materials for the members 41, but the rate of diffusion ordinarily is slower.

The insulating member 40 preferably has copper-coated apertures 42 therein integral with the copper strips 41. At least one of the groups of terminals 43 and apertures 42 is coated with at least one member selected from the group consisting essentially of indium, gallium, tin, indium alloys and gallium alloys. The terminals may be of beryllium copper or other non-ferrous metal or non-ferrous alloy such as copper, zinc, tin, aluminum or brass or the terminals may be of any of the body materials mentioned above as being suitable for the conductive members 41. As will be more fully explained subsequently, the terminals preferably are of a multiple, laminated structure of metals, such as carbon-steel, Kovar (nickel-copper) or alloy 42 (nickel-iron), carbon-steel, Kovar or alloy 42 terminals being clad with copper or copper bearing alloy on their surfaces. The terminals preferably are electroplated to a thickness of $25\times10^{-6}$ inch with indium, which has a melting point of 312° F. Suitable indium and gallium alloys are, for example, tin-indium, aluminum-indium and zinc-indium having an indium content of at least 50% by weight and tin-gallium, aluminum-gallium and zinc-gallium having a gallium content of at least 50% by weight. Obviously, a plurality of the materials, for example, tin, aluminum and zinc, suitable for alloying with indium or gallium may form the minor proportion of the indium alloy or the minor proportion of the gallium alloy.

In lieu of indium coating the terminals 43 or in addition to indium coating the terminals 43, the copper coatings Kovar, or alloy 42 which is a nickel-iron alloy consisting ber selected from the group consisting essentially of indium, gallium, tin, indium alloys and gallium alloys.

Considering the structure of the terminals 43 in greater detail, the terminals are, for example, pins having a longitudinal taper of less than 6 degrees. The taper may, for example, be ¼ inch per foot or approximately 3½ degrees. The terminals 43 may have a length of, for example, $\frac{1}{16}$ inch and a diameter of, for example, .021 inch at diameter A and, for example, .020 inch at diameter B, in accordance with the longitudinal taper of the terminals. The pins may be manufactured by, for example, rolling copper clad wire to the desired taper and subsequently cutting.

As mentioned previously each terminal 43 preferably has a body of a ferrous alloy, for example, carbon-steel, Kovar, or alloy 42 which is a nickel-iron alloy consisting of 58% nickel and 42% iron, known commercially as alloy 42. Indium, gallium, tin, the indium alloys and the gallium alloys mentioned above as being suitable for coating the terminals will not readily diffuse into iron or ferrous alloys. Accordingly, the terminal 43 is coated, for example, by electroplating, with a layer of non-ferrous metal or a non-ferrous alloy, for example, copper or any of the non-ferrous metals and non-ferrous alloys previously mentioned as being suitable for the bodies of the terminals. A layer of indium, gallium, tin, any of the indium alloys or any of the gallium alloys mentioned above as being suitable for coating the terminals of the FIGS. 1–4 embodiments is coated, for example, by electroplating, over the copper layer of each terminal or is coated over the wall of each aperture 12 or both. The copper layer has a thickness of, for example, .001 inch.

The taper of the apertures preferably matches the taper of the terminals so that the terminals mate with the apertures to provide a lateral or radial pressure contact therewith, due to residual centripetal stress of the plated hole metal. Insulating board thicknesses in the range of, for example, .036 to .075 inches are practical with, for example, as many as 10 layers of printed circuit conductors.

After the apertures 42 are coated, the apertures are reamed to close tolerances with a taper reamer to provide a taper of approximately .001 inch longitudinally of the apertures. The taper pins or terminals are plated with copper and then with indium. The terminals are then inserted into the apertures with matching or mating tapers under controlled heat and pressure, for example, at a temperature of 350° F. and a longitudinal pressure of 20 pounds. This results in a small expansion of the plated aperture, subsequently providing residual centripetal stress so that a lateral or radial pressure of, for example, of the order of 300 pounds per square inch is exerted between the terminals and the coating of the apertures. After insertion, the pins are trimmed as required to approximately $\frac{1}{16}$ inch length with, for example, .005 inch extension beyond the aperture at one end and .015 inch extension beyond the aperture at the other end.

The structure is then disposed at a temperature sufficient to form a diffusion bond between the terminals and the coatings of the apertures. Preferably the terminals are indium-coated and the structure is heated to a temperature of, for example, 500° F. which is above the melting point of indium, namely, 312° F. and below the breakdown point of the insulating member, for example, 600° F., to form an indium diffusion bond.

When the structure is heated to a temperature above 312° F., the indium melts and diffuses into the copper coating of the terminals and into the copper alloy coatings of the apertures. After the structure has been maintained at a temperature above the melting point of indium for a relatively short period of, for example, 30 minutes, the diffusion process can be continued at room temperature, but at a much slower pace. After the diffusion process is completed, the terminals are bonded to the coatings of the apertures by a copper-indium alloy and the pure indium in the regions of intimate contact between the terminals and aperture coatings is substantially completely consumed. Some free indium remains at the rim of the pins and apertures on the outsides of the circuit board.

The bond has a high "pull" strength of, for example, 70 pounds necessary to break the bond as compared with, for example, 38 pounds of a dip soldered terminal of .062 inch outer diameter by .093 inch long. The high "pull" strength is accomplished by the existence of the bond over substantially the entire bonding surface of the aperture and the high shear strength (approximately 26,000 pounds per square inch) of the copper-indium alloy junction. Further, bonding area may be provided between a flange 14 of the terminal 13 and a copper member 11 as represented in FIG. 4. The copper-indium alloy has a melting point of approximately 900° C., and thus an alloy having a high melting point and serving as a bond is formed at a relatively low temperature.

The terminal pins 43 are suitable for welding the leads 44 of integrated circuit packages thereto by utilizing welding electrodes in contact with the leads 44 placed on the ends of each pin extending from opposite sides of the board 40 to pass the welding current through the pin longitudinally. Component leads may, for example, be gold-plated Kovar ribbon, .003 inch thick by .010 inch wide.

From the foregoing description, therefore, it will be seen that a printed circuit structure constructed in accordance with the invention has the salient advantage that the electrical terminals of the structure are integrally bonded to the copper conductors of the printed circuit structure and form unitary extensions of the copper conductors. The structure has the desirable electrical characteristics of high conductivity and electrically uniform, noise-free performance and the desirable mechanical characteristic of high strength. Electrical wire conductors may be readily welded to the terminlas to provide an assembly avoiding the disadvantages of soldered connections. Also, as explained in connection with the FIG. 6 embodiment, a diffusion bond may be formed between the wire conductors and the terminals to provide a unitary structure.

It is desirable in some applications, for example, military applications, to be able to form a junction or connection by means of combining, for example, welding and soldering, or wire wrap-around and soldering, or crimping and soldering. The thin coat of indium, gallium, tin, indium alloys or gallium alloys on the surface of the terminal enables easy and superior soldering, due to the well known property of indium, gallium, tin, indium alloys or gallium alloys to wet with all common solders.

Printed circuits having terminals diffusion bonded thereto as described previously facilitates repair or replacement many times of components soldered to the terminals.

The invention can be utilized in a single-sided, two-sided, or multiple-layer printed circuit board. A multiple layer board has been represented as an example of an embodiment suitable for connection to a so-called mother board by any suitable method, such as a wire-wrap method.

The printed circuit structure is adapted for the positioning and attachment of integrated or packaged circuit components, such as micro-modules, flat against the surface of the board with the flat conductor leads being coplanar and free from mechanical contact with the end of the pin. This allows the use of a standard welding machine which has one electrode in contact with one end of the pin on one side of the board and the other electrode on the opposite side of the board, pressing the flat lead to the pin.

While there have been described what are at present considered to be the preferred embodiments of this invention, it will be obvious to those skilled in the art that various changes and modifications may be made therein without departing from the invention, and it is, therefore, aimed to cover all such changes and modifications as fall within the true spirit and scope of the invention.

Having thus described my invention, what I claim and desire to protect by Letters Patent is:

1. A printed circuit structure comprising an insulating member carrying copper printed circuit members and having apertures having copper coatings integral with said copper members, and copper alloy terminals disposed in said apertures and being diffusion bonded to the coatings of said apertures by a copper-indium alloy, the indium being substantially completely diffused into said coppei alloy terminals and into said copper coatings of said apertures.

2. A printed circuit structure comprising an insulating member carrying conductive printed circuit members and having apertures having conductive metal coatings integral with said conductive members, and conductive terminals disposed in said apertures and diffusion bonded to the coatings of said apertures by an alloy of the surface material of said terminals with at least one member selected from the group consisting essentially of indium, gallium, pure tin, indium alloys containing a major proportion of indium, and gallium alloys containing a major proportion of gallium and by an alloy of the material of said metal coatings of said apertures with said selected member, said selected member being substantially completely diffused into said terminals and into said metal coatings of said apertures.

3. A printed circuit structure in accordance with claim 2 in which said selected member is an indium alloy containing a major proportion of indium.

4. A printed circuit structure in accordance with claim 2 in which said selected member is indium.

5. A printed circuit structure in accordance with claim 2 in which said terminals are ferrous terminals coated with a material selected from the group consisting of copper, beryllium copper, zinc, tin, aluminum, brass, antimony, bismuth, cadmium, gold, lead, magnesium, manganese, molybdenum, palladium, platinum, silver, titanium and zirconium, alloys having a major proportion by weight of any of the foregoing metals and alloys, and copper-nickel alloy having a major proportion by weight of copper.

6. A printed circuit structure in accordance with claim 2 in which said metal coatings of said apertures are of a material selected from the group consisting essentially of copper, beryllium copper, zinc, tin, aluminum, brass, antimony, bismuth, cadmium, gold, lead, magnesium, manganese, molybdenum, palladium platinum, silver, titanium and zirconium, alloys having a major proportion by weight of any of the foregoing metals and alloys, and copper-nickel alloy having a major proportion by weight of copper and in which said terminals are of a material selected from the group consisting essentially of copper, beryllium copper, zinc, tin, aluminum, brass, antimony, bismuth, cadmium, gold, lead, magnesium, manganese, molybdenum, palladium platinum, silver, titanium and zirconium, alloys having a major proportion by weight of any of the foregoing metals and alloys, and copper-nickel alloy having a major proportion by weight of copper.

7. A printed circuit structure in accordance with claim 2 in which said terminals are conductive tubular members each having a substantially annular cross section over a portion thereof and each having a longitudinal slot along said portion.

8. A printed circuit structure in accordance with claim 2 in which said terminals are conductive tubular members through which wire conductors are disposed, said wire conductors being diffusion bonded to said terminals by an alloy of the internal surface material of said terminals with at least one member selected from the group consisting essentially of indium, gallium, pure tin, indium alloys containing a major proportion of indium, and gallium alloys containing a major proportion of gallium, and by an alloy of the wire conductors with the last-mentioned selected member, the last-mentioned selected member being substantially completely diffused into the terminals and the wire conductors.

9. A printed circuit structure comprising an insulating member carrying conductive printed circuit members and having apertures having conductive metal coatings integral wtih said conductive members and conductive solid terminals disposed in said apertures and diffusion bonded to the coatings of said apertures by an alloy of the material of said terminals with at least one member selected from the group consisting essentially of indium, gallium, pure tin, indium alloys containing a major proportion of indium, and gallium alloys containing a major proportion of gallium, and by an alloy of said metal coatings of said apertures with said selected member, said selected member being substantially completely diffused into said terminals and into said metal coatings of said apertures.

10. A printed circuit structure in accordance with claim 9 in which at least one of the groups of aperture coatings and terminals have a longitudinal taper.

11. A printed circuit structure in accordance with claim 9 in which said terminals comprise solid tapered pins extending through said aperture coatings and extending beyond said coatings on both sides of said insulating member to form terminals adapted for welding of conductors thereto.

12. A printed circuit structure in accordance with claim 9 in which said selected member is an indium alloy containing a major proportion of indium.

13. A printed circuit structure in accordance with claim 9 in which said selected member is indium.

14. A printed circuit structure in accordance with claim 9 in which said conductive members are of a material selected from the group consisting essentially of copper, beryllium copper, zinc, tin, aluminum, brass, antimony, bismuth, cadmium, gold, lead, magnesium, manganese, molybdenum, palladium, platinum, silver, titanium and zirconium alloys having a major proportion by weight of any of the foregoing metals and alloys, and copper-nickel alloy having a major proportion by weight of copper and in which said conductive terminal surfaces are of a material selected from the group consisting essentially of copper, beryllium copper, zinc, tin, aluminum, brass, antimony, bismuth, cadmium, gold, lead, magnesium, manganese, molybdenum, palladium, platinum, silver, titanium and zirconium, alloys having a major proportion by weight of any of the foregoing metals and alloys, and copper-nickel alloy having a major proportion by weight of copper.

15. A printed circuit structure in accordance with claim 9 in which said conductive members are copper and in which said conductive terminals contain copper and in which said selected member is indium.

16. A printed circuit structure in accordance with claim 9 in which said insulating member carries said conductive members in a plurality of layers and in which said conductive members are selectively interconnected to said conductive coatings.

References Cited by the Examiner

UNITED STATES PATENTS

| | | | |
|---|---|---|---|
| 2,814,024 | 11/1957 | Narozny. | |
| 2,909,833 | 10/1959 | Murray et al. | |
| 2,990,533 | 6/1961 | Huges | 339—220 X |
| 3,046,651 | 7/1962 | Olmon et al. | 29—504 |
| 3,102,213 | 8/1963 | Bedson et al. | 174—68 |

JOHN F. BURNS, *Primary Examiner.*

DARRELL L. CLAY, *Examiner.*